United States Patent
Dlugosch et al.

[11] Patent Number: 5,948,521
[45] Date of Patent: Sep. 7, 1999

[54] THERMALLY CONDUCTIVE, ELECTRICALLY INSULATING CONNECTION

[75] Inventors: Dieter Dlugosch, Heilsbronn; Karl-Heinz Gunzelmann, Nuremberg; Karl-Heinz Ideler, Spardorf, all of Germany

[73] Assignee: Siemens Aktiengesellscahft, Munich, Germany

[21] Appl. No.: 08/692,237

[22] Filed: Aug. 7, 1996

[30] Foreign Application Priority Data

Aug. 11, 1995 [DE] Germany ............... 195 29 627

[51] Int. Cl.⁶ ............... B32B 3/06; B05D 1/08
[52] U.S. Cl. ............... 428/307.3; 428/307.7; 428/312.8; 428/317.1; 428/317.3; 428/319.1; 428/319.3; 428/414; 427/446; 427/453; 427/294; 156/60; 156/182; 156/330
[58] Field of Search ............... 428/307.3, 312.8, 428/317.1, 317.3, 319.3, 307.7, 319.1, 414; 427/294, 419.1, 419.2, 419.5, 427, 453, 446, 443.2; 156/60, 182, 330

[56] References Cited

U.S. PATENT DOCUMENTS

| | | | |
|---|---|---|---|
| 4,882,455 | 11/1989 | Sato et al. ............... | 174/68.5 |
| 5,276,423 | 1/1994 | Breit et al. ............... | 338/308 |
| 5,686,172 | 11/1997 | Ohya et al. ............... | 428/210 |

FOREIGN PATENT DOCUMENTS

| | | |
|---|---|---|
| 0 042 693 | 12/1981 | European Pat. Off. . |
| 89 14 493 U | 6/1990 | Germany . |

Primary Examiner—Paul Thibodeau
Assistant Examiner—Holly C. Rickman
Attorney, Agent, or Firm—Hill & Simpson

[57] ABSTRACT

A thermally conductive, electrically insulating connection, which is not sensitive to air moisture comprises a ceramic layer formed by thermal spraying on a surface of the workpiece, which layer is either impregnated or sealed with electrically insulating material and is joined to another workpiece which may be a ceramic layer which has been either impregnated or sealed and attached to another member. The connection is particularly useful in power assemblies with at least one power component for conducting away lost heat from the component with a sufficient electrical insulation of the component from the cooling body or heat sink.

18 Claims, 1 Drawing Sheet

THERMALLY CONDUCTIVE, ELECTRICALLY INSULATING CONNECTION

BACKGROUND OF THE DISCLOSURE

The present application is directed to a thermally conductive electrically insulating connection between two members and the method of forming the connection.

In the manufacturing of power assemblies having at least one power component, a thermally conductive, electrically insulating connection is required between the power component and a heat sink or cooling body. This connection provides two functions one being the conducting away of lost heat and the other being ensuring a sufficient electrical insulation from the cooling body or heat sink. For the manufacture of connections of this type, it is known to attach the power assembly or an individual power component to a copper bearer or member for example by means of soldering or gluing. The copper bearer or member, which serves as a heat spreading element, is connected with an associated heat sink predominantly via an electrically insulating ceramic intermediate piece which is preferably made of aluminum oxide. The quality of the heat conductivity also depends in particular on whether this connection is made by mechanical pressing, gluing or soldering. To obtain a mechanical solidity in manufacturing and processing of this type of connection between a power component and cooling or heat sink, the ceramic intermediate pieces must be thicker than is required for the electrical insulation and this is a disadvantage. This increased thickness will limit the achievable heat conductivity of the connection.

European 0 042 693 discloses a ceramic intermediate piece which avoids the above described disadvantage and which is obtained by means of plasma-sprayed ceramic layers. The ceramic layers are thus attached to the heat spreading elements and the heat spreading elements are then glued to the associated cooling bodies via the ceramic layers. The layer consistency and layer thickness determines the heat conductivity and the electrical insulating effect and can be adapted to different requirements within broad limits. However, the hygroscopic property of the plasma sprayed ceramic layers have disadvantageous effects particularly when, for example, the construction of the connection cannot be shielded against air moisture using insulating gels, for example silicon based gels, in a long term stable manner.

A power assembly is disclosed in German Gebrauchsmuster 89 14 493 U1 that comprises a thermal conductive, electrically insulating connection between a bearer or member and the cooling body or heat sink. The insulating layer is thus fashioned not as a previously manufactured part but rather as a coating that is either applied to the cooling or heat sink and glued to the bearer or applied to the bearer and glued to the heat sink or cooling body. In a variant, an anodic coating is formed as an insulation layer on the surface of the cooling body which is made of aluminum. This anodic coating which is formed by anodic oxidation of the aluminum, does not however comprise a smooth aluminum oxide surface but rather a nonuniform surface in the manner of a cratered landscape. If the remaining thickness of the anodic coating between the crater valleys is too small with respect to the required electrical strength, the anodic coating is additionally coated with a layer of polytetrafluorethylene which is just thick enough to fill the craters created during the oxidation. The smoothing of the surface of the anodic coating makes the insulating layer thicker and increases the electrical strength.

SUMMARY OF THE INVENTION

The object of the present invention is to construct a thermally conductive, electrically insulating connection and a method for the manufacture thereof on the basis of thermally sprayed ceramic layers in such a way that the connection is not sensitive to the influence of air moisture while having high heat conductivity and strong insulating effects.

To accomplish these goals, the thermal conductive electrical insulating connection between two work pieces comprises a ceramic layer attached to at least one of the work piece surfaces by means of thermal spraying, the ceramic layer being impregnated or sealed with an electrical insulating material, and the impregnated or sealed ceramic layer being connected with the other workpiece surface or with a ceramic layer that is impregnated or sealed and attached to the other work surface.

The method for manufacturing a thermal conductive electrical insulating connection between two workpieces comprises the steps of thermally spraying a ceramic layer on at least one workpiece surface, impregnating or sealing the ceramic layer with an electrically conductive material, and then connecting the impregnated or sealed ceramic layer with another work surface or with a ceramic layer that has been impregnated or sealed and is attached to another workpiece.

The invention is based on the knowledge that an impregnation or sealing of a thermally sealed sprayed ceramic layer closes the pores of the layer at least in the surface region without effecting both the heat conductivity and the insulating effect and thereby securely prevents undesirable effects of air moisture. The additional connection of the ceramic layer with the second workpiece or with the second ceramic layer is not hindered by the impregnation or sealing and can be carried out in a known way for example by means of ultrasonic welding or by means of gluing.

In the sense of the present invention the term "impregnation" is used to mean the filling up the surface pores or complete saturation of the porous ceramic layer with an electrically insulating material which can also form a protective film on the surface if warranted.

In the sense of the present invention, the term "sealing" is used to mean a surface treatment of the porous ceramic layer with an electrically insulating material that penetrates into the pores at least in the surface region and forms a protective film on the surface.

The ceramic layer is preferably an oxide ceramic which is preferably an aluminum oxide. The sealing or impregnating is with a resin or an adhesive and preferably it is with an epoxy resin. It also can be by a ceramic glaze which has a low melting point. To form the connection between the impregnated or sealed ceramic layer and a surface of another workpiece or another ceramic layer that is attached to another workpiece, the connection can be by an adhesive layer which may be made of an epoxy resin and the adhesive layer may be mixed with a thermally conductive powder.

In the method, the ceramic layer is preferably attached by means of plasma spraying and the impregnation or sealing is preferably carried out with a resin or adhesive by a low pressure or vacuum impregnation if the sealing or impregnation material is an epoxy resin, this is preferably obtained by a low pressure or vacuum impregnation.

Other advantages and features will be readily apparent from the following description of the preferred embodiments, the drawings and claims.

DESCRIPTION OF THE PREFERRED EMBODIMENTS

Figure 1:
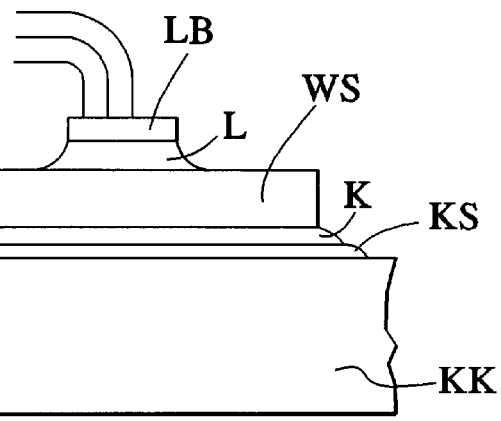
FIG. 1 is a side view of an arrangement of a power component on a cooling body or heat sink.

The principles of the present invention are particularly useful in an arrangement illustrated in FIG. 1. In the arrangement of FIG. 1, a power component LB such as a power semiconductor is connected by a solder layer L with a heat spreading element WS made of copper. The electrical connection of the power component LB occur by bonded wires which are indicated in FIG. 1 and extend to a circuit not illustrated. The heat spreading element WS is disc-shaped and is connected with a heat sink or cooling body KK by a thermally conductive adhesive layer K and by a thermally conductive, electrically insulating ceramic layer KS. The cooling body or heat sink KK is made of a metal that is highly thermal conductive such as copper or aluminum. The heat sink KK can also take the form of a rectangular tube through which cooling water flows.

The ceramic layer KS is attached to the surface of the heat sink KK by means of a thermal spraying preferably by means of plasma spraying. The thickness of the ceramic layer KS, which is made of oxide ceramics and preferably aluminum oxide, is thus determined by the required electrical insulating capacity.

A ceramic layer KS, which is attached to the cooling body or heat sink KK by means of thermal spraying comprises a certain porosity which without further measure would lead to a undesirable hygroscopicitiy of the layer system. This porosity of the layer KS is shown in highly exaggerated form in the cross sectional view of FIG. 2 by means of a large distance between the individual ceramic particles KP. In addition, by means of this highly exaggerated representation of the porosity, the effect of the impregnation of the ceramic layer KS is explained in which the electrical insulating material M completely penetrates the ceramic layer KS thereby securely preventing any hygroscopicity of the layer system. In place of the impregnation shown in FIG. 2, the ceramic layer KS can however also be sealed with the electrically insulating material M penetrating into the pores at least in the surface region to form a protective film on the surface. In both cases a ceramic glaze that melts for example in the temperature range of between 600° C. and 800° C., a hardenable resin or a hardenable adhesive can be used as the electrically insulating material M.

An epoxy resin is preferably used for the impregnation or sealing of the ceramic layer KS. For a condensation-free impregnation or sealing, the coating heat can be used or a baking process can be interposed. It is thereby of particular importance that the epoxy resin remain free of pores after the treatment of the ceramic layer KS. This is ensured by for example a low pressure or vacuum impregnation.

Figure 2:
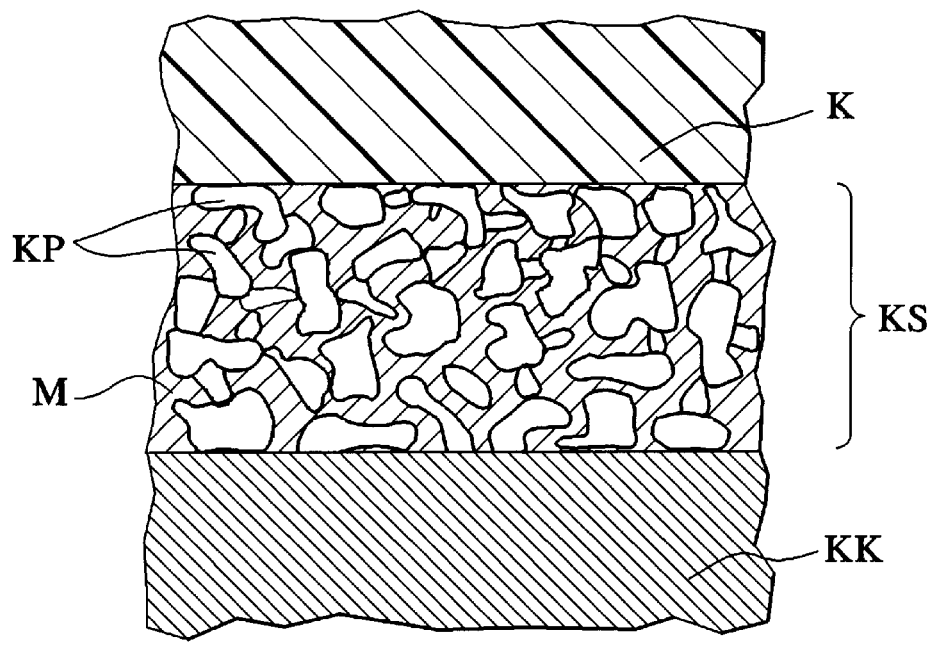
FIG. 2 is a highly enlarged partial cross sectional view through the connecting area of the arrangement shown in FIG. 1.

In the exemplary embodiment shown in FIGS. 1 and 2, the impregnated ceramic layer KS is connected with the heat spreading element WS by an adhesive layer K. As material for the adhesive layer K, an epoxy resin is preferably like used. For the further improvement of the heating conductivity a thermal conductive powder such as a nickel powder can also be mixed with the adhesive layer K.

Figure 3:
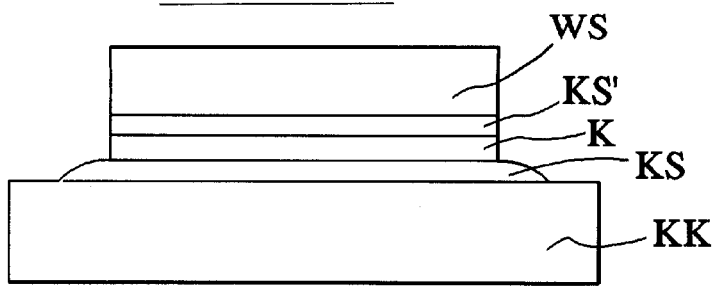
FIG. 3 is a side view of a connection between two workpieces each having a ceramic layer.

In variation from the presently described exemplary embodiment shown in FIGS. 1 and 2, the ceramic layer KS can also be attached to the heat spreading element WS and subsequently impregnated or sealed. It is also possible to attach a ceramic layer both to the cooling body KK and to the heat spreading element WS as illustrated in FIG. 3 by a ceramic layer KS' attached to the heat spreading element WS and a ceramic layer KS attached to the heat sink KK. After impregnation of the two ceramic layers KS and KS', they are then connected to one another by an adhesive layer K.

Although various minor modifications and changes may be suggested by those versed in the art, it is the intention of the inventors to embody within the patent granted hereon all changes and modifications as reasonably and properly come within the scope of their contribution to the art.

We claim:

1. A thermally conductive, electrically insulating connection between two workpieces, said connection comprising a ceramic layer being attached to at least one workpiece surface, said layer being a thermally sprayed layer and having means for preventing any hygroscopicity in the layer, said means comprising all outer surfaces of the layer being sealed with an electrically insulating material to form sealed surfaces, one of said sealed surfaces of the ceramic layer being connected by a layer of adhesive with a facing surface of the other workpiece of the two workpieces.

2. A thermally conductive, electrically insulating connection according to claim 1, wherein the ceramic layer is an oxide ceramic.

3. A thermally conductive, electrically insulating connection according to claim 2, wherein the oxide ceramic is aluminum oxide.

4. A thermally conductive, electrically insulating connection according to claim 1, wherein the ceramic layer is sealed with a material selected from a group consisting of resin and adhesive.

5. A thermally conductive, electrically insulating connection according to claim 4, wherein the resin is an epoxy resin.

6. A thermally conductive, electrically insulating connection according to claim 1, wherein the ceramic layer is sealed with a ceramic glaze having a melting point in a range of between 600° and 800° C.

7. A thermally conductive, electrically insulating connection according to claim 1, wherein the adhesive layer is an epoxy layer.

8. A thermally conductive, electrically insulating connection according to claim 1, wherein the adhesive layer is mixed with a thermally conductive powder.

9. A thermally conductive, electrically insulating connection according to claim 1, wherein the facing surface of the other workpiece is a sealed surface, which is sealed with an electrically insulating material, of a ceramic layer which is attached to the other workpiece.

10. A thermally conductive, electrically insulating connection according to claim 9 wherein both ceramic layers are completely impregnated with the electrically insulating material.

11. A thermally conductive, electrically insulating connection according to claim 1 wherein the ceramic layer is completely impregnated with the electrically insulating material.

12. A method for manufacturing a thermally conductive electrically insulating connection between two workpieces comprising the steps of thermally spraying a ceramic layer on a surface of one workpiece, forming means for preventing any hygroscopicity in the ceramic layer by sealing all outer surfaces of the ceramic layer with an electrically insulating material, and then connecting one of the outer surfaces of the sealed ceramic layer to another workpiece surface by providing an adhesive layer between the one outer surface and said another workpiece surface.

13. A method according to claim 12, wherein the step of thermally spraying comprises plasma spraying the ceramic layer onto the workpiece.

14. A method according to claim 12, the step of sealing utilizes a low pressure impregnation of the ceramic layer with a material selected from a resin and an adhesive.

15. A method according to claim 14, wherein the step of sealing by a low pressure impregnation utilizes a vacuum impregnation of the ceramic layer with an epoxy resin.

16. A method according to claim 12 wherein the step of providing an adhesive layer provides an epoxy resin.

17. A method according to claim 12, which includes mixing a thermally conductive powder in the adhesive layer.

18. A thermally conductive, electrically insulating connection between elements including a heat spreading element and a heat sink, said connection comprising a ceramic layer being attached to a surface of one of the two elements, said ceramic layer being a thermally sprayed layer and having means for preventing any hygroscopicity in the sprayed layer, said means comprising all outer surfaces of the sprayed layer being impregnated with an electrically insulating material to form sealed surfaces, one of said sealed surfaces of the ceramic layer being connected by an adhesive layer with a surface of the other element of the two elements.

* * * * *